United States Patent [19]
Rotzow

[11] 4,000,045
[45] Dec. 28, 1976

[54] ELECTROPLATING CONTACTS OF PRINTED CIRCUITS

[75] Inventor: Richard Ralph Rotzow, Ontario, Calif.

[73] Assignee: Burroughs Corporation, Detroit, Mich.

[22] Filed: Nov. 21, 1975

[21] Appl. No.: 633,964

Related U.S. Application Data

[62] Division of Ser. No. 544,312, Jan. 27, 1975.

[52] U.S. Cl. .................................................. 204/15
[51] Int. Cl.$^2$ ........................................... C25D 5/02
[58] Field of Search .............. 204/15, DIG. 7, 18 R, 204/16, 17

[56] References Cited
UNITED STATES PATENTS

| | | | |
|---|---|---|---|
| 2,834,723 | 5/1958 | Robinson | 204/15 |
| 3,014,851 | 12/1961 | Bommerscheim | 204/15 |
| 3,597,333 | 8/1971 | Kulesza | 204/15 |

OTHER PUBLICATIONS

IBM Tech. Disclosure Bulletin, vol. 2, No. 3, Oct. 1959, p. 32.

*Primary Examiner*—T. M. Tufariello
*Attorney, Agent, or Firm*—Nathan Cass; Kevin R. Peterson; Edward J. Feeney, Jr.

[57] ABSTRACT

A printed-circuit board requiring precious metal electroplating of its contact finger areas is adapted for such plating by a temporarily affixed electroplating current carrier of metallic foil held in contact with other printed wiring interconnected with the contact finger areas. The metallic foil is shielded from contact with electroplating baths by a strip of dielectric plastic film, the film and the foil being temporarily held in a selected position on the board by a layer of non-setting pressure-sensitive adhesive.

4 Claims, 5 Drawing Figures

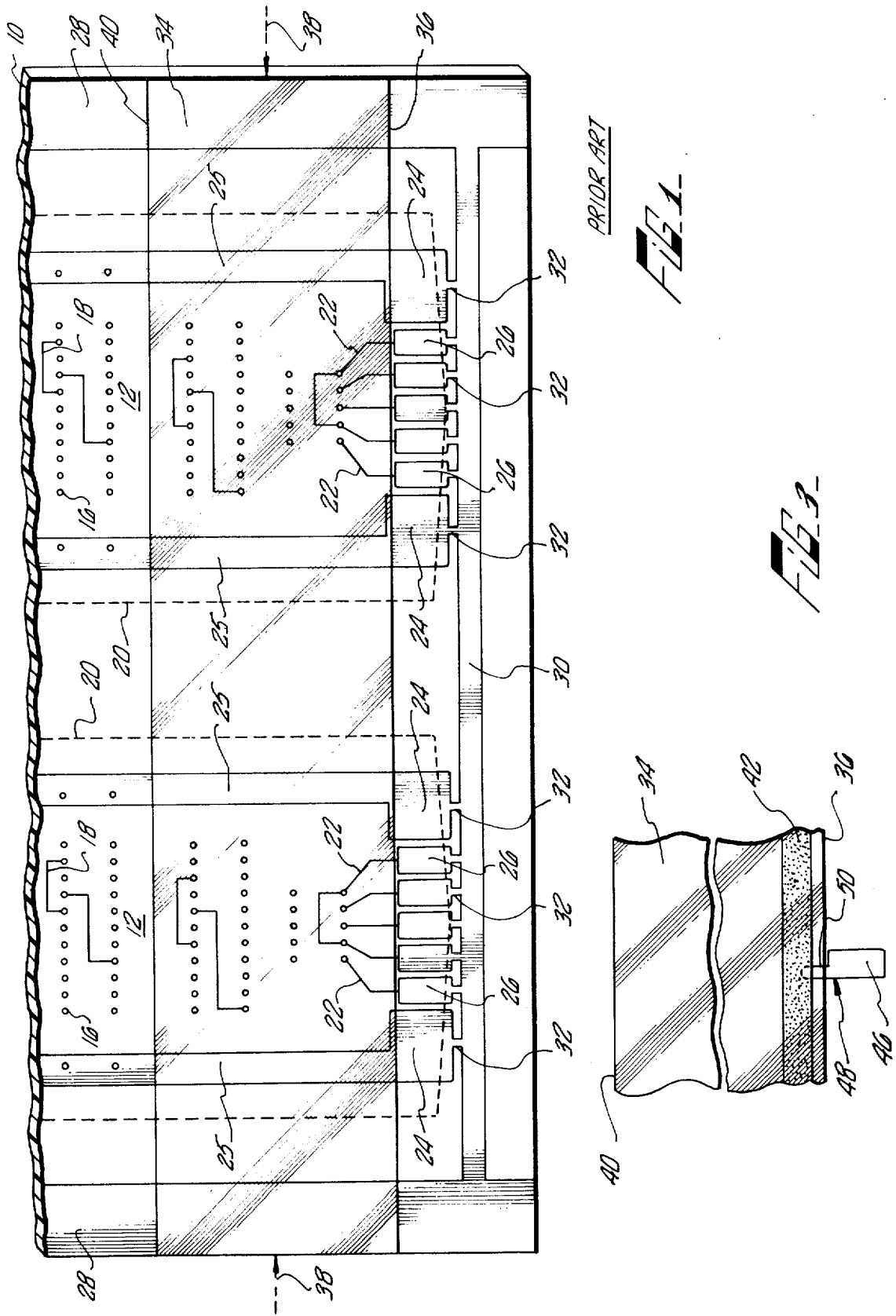

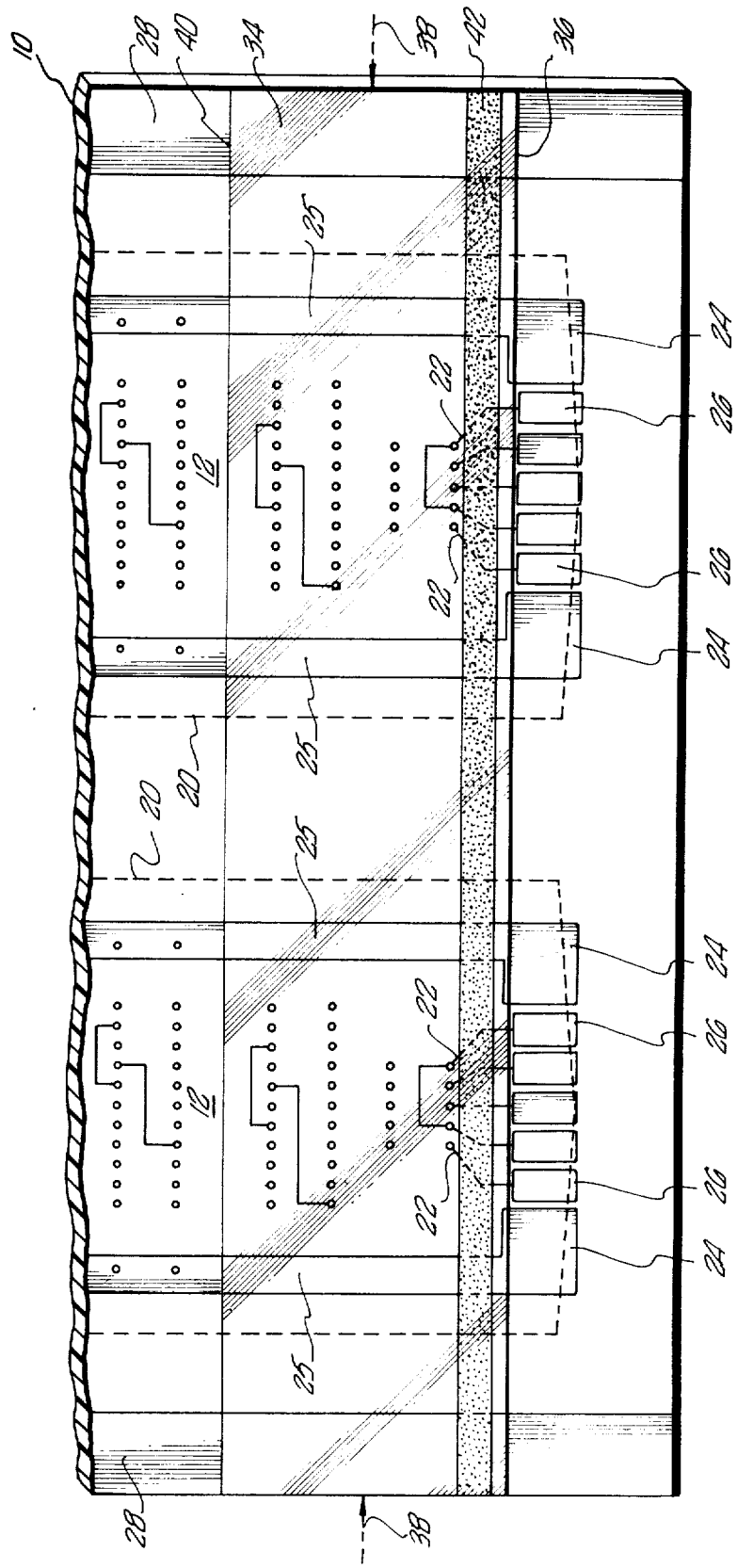

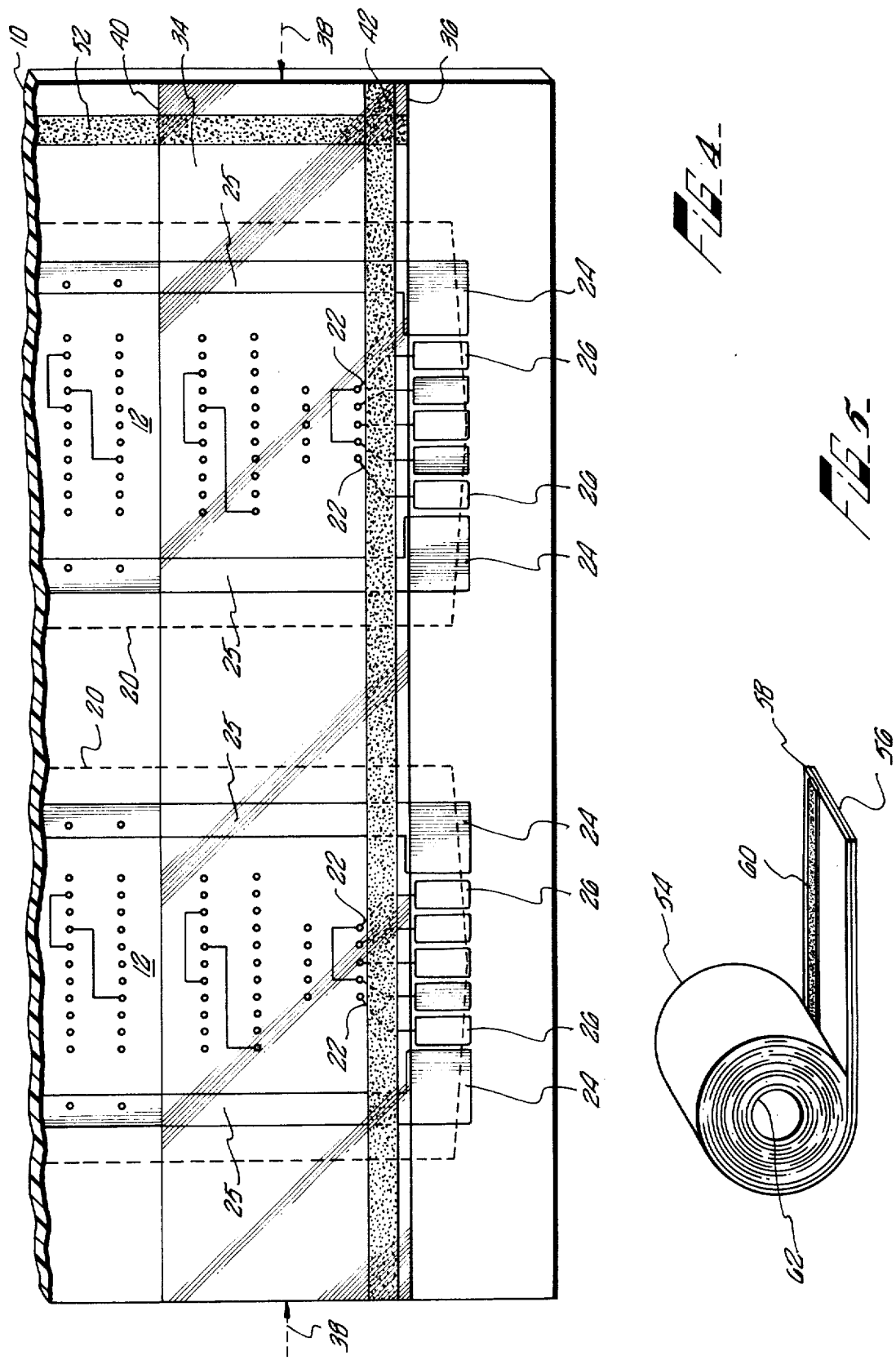

ELECTROPLATING CONTACTS OF PRINTED CIRCUITS

CROSS REFERENCE TO RELATED APPLICATION

This application is a division of application having U.S. Ser. No. 544,312 filed Jan. 27, 1975 for Electroplating Contacts of Printed Circuits.

BACKGROUND OF THE INVENTION

This invention relates to the manufacture of printed-circuit boards and more particularly to an adaptation of such boards for efficient electroplating of certain portions of the metallic wiring deposited thereon such as the contact finger areas.

Electrical circuit boards having in one or another manner wiring printed thereon have long been known in the art and have contributed substantially to reducing the cost of fabricating and maintaining complex electrical systems as well as to reducing the size of such systems. A printed-circuit board is readily adapted to large-quantity production.

Although the advantages of printed wiring circuitry are obvious, stringent requirements for long term reliability of the board may present particular problems in their fabrication. One area of particular concern is in the preparation of those portions of the printed wiring termed the contact finger areas or contact tabs. An array of one or more of these tabs comprise, in effect, a plug intended to be mated with a female connector assembly having sping-loaded pressure contacts which establish electrical continuity between the circuits and circuit components mounted on the board and other parts of the electrical system external to the printed-circuit board. For long-term reliability of the board and the system as a whole, particularly in digital computer applications where signal currents may be very small, it is essential that this electrical continuity not deteriorate either due to surface corrosion or other physical or chemical change in the layers of metal comprising the contact tabs. To achieve this end, the contact tabs, normally comprising a base layer of copper, and sometimes an additional layer of nickel, are commonly given a final exterior coating of a precious metal such as pure or alloyed gold. The preferred method of producing the precious metal coating is by electroplating. It is desirable to use only the minimally sufficient amount of such precious metal in the electroplating process due, obviously, to its high cost.

Printed-circuit boards are fabricated by multi-step processes well known to those skilled in the art. In the base of all circuit boards is at least one flat sheet or plate of insulating substrate usually made of molded epoxy-glass or phenolic resin material. The blank base for the board is commonly rectangular in shape. The dimensions of the blank board need not be precisely controlled since the finished portion of the printed-circuit board is ordinarily cut away from the remainder of the substrate by precise blanking or routing procedures. The blank board is ordinarily made large enough to accommodate certain expendable auxilary printed wiring which is provided to be useful in certain intermediate steps of the processing. However, a significant portion of this auxiliary wiring is itself plated with precious metal. As much as fifty percent of the precious metal plated on the board may be deposited on auxiliary wiring. Eventually, when the finished portion of the printed-circuit board is cut away from the remainder, the portion of the substrate having the auxiliary wiring thereon is left as scrap. While the precious metal plated on the scrap may be reclaimed, the reclamation process itself is an added cost in printed-circuit board production.

It has been the prior art practice to include a printed-wire bus bar connected to each of the contact tabs as part of the auxiliary wiring on a substrate. This bus bar enables the precious metal electroplating of the contact tabs by completing a path for electroplating current from each of the contact tabs to a source of negative potential. However, in the prior art practice, not only are the contact tabs subject to contact with electroplating baths but so also is the bus bar and each bus bar connection to a contact tab. The present invention makes the use of such a printed-wire bus bar unnecessary by providing a contact tab electroplating current path which is protected from contact with electroplating baths.

SUMMARY OF THE INVENTION

Accordingly, it is a broad object of the present invention to provide improved means and methods for adapting substrates with printed wiring thereon for efficient electroplating of selected portions of that wiring.

Another object of the invention is to provide means and methods for conducting electroplating current from contact finger areas of printed circuits wherein the current carrying means is shielded from contact with electroplating baths when the contact finger areas are immersed in those baths.

A still further object of this invention is to provide an electroplating current conductor which is readily affixed to a substrate prior to electroplating an additional metallic coating on printed-wire portions thereon and readily removed thereafter, the electroplating current conductor being shielded from contact with electroplating baths.

The present invention improves over the prior art by reducing the cost of printed-circuit board production without requiring significant modifications to existing printed-circuit board production equipment. The cost reduction results from a reduction in the usage of precious metal when the contact finger areas of printed-circuit boards are given a surface coating by electroplating. To attain this cost reduction, a conductor, preferably a strip of metallic foil, if affixed to a printed-circuit board on a region of that board adjacent to the region having the contact finger areas requiring electroplating. The strip of metallic foil is held in contact with printed wiring which is, in turn, electrically continuous with the contact finger areas. The region of the board having the metallic foil affixed thereto and the strip of foil itself is shielded from contact with electroplating baths by a strip of thin resilient dielectric material such as a film of plastic or the like. A layer of a non-setting pressure-sensitive adhesive material, coated on one side of the plastic film, holds both the plastic film and the metallic foil in place on the printed-circuit board. The adhesive material is also electrically non-conductive and forms a seal preventing any seepage of electroplating fluid under the plastic film.

In practicing the invention, it is preferable to pre-fabricate a jumbo roll of a composite tape including the plastic film with the layer of adhesive material coated thereon and with the strip of metallic foil held in place on the composite tape by the adhesive material. Required lengths of the composite tape may then be conveniently unwound from the roll and used to adapt circuit boards for electroplating either manually or by automated mechanical means.

BRIEF DESCRIPTION OF THE DRAWINGS

Other objects, features, advantages and uses of the invention will become apparent to those skilled in the art as disclosure is made in the following description of preferred embodiments of the invention as illustrated in the accompanying drawings in which the same reference numerals are used in each of the several drawings to represent the same elements:

FIG. 1 is a sketch of a portion of an insulative substrate as it appears at an intermediate stage of the fabrication of printed-circuit boards, the substrate having plated through-holes therein and printed wiring thereon, the substrate and printed wiring thereon being adapted in the manner of the prior art for the electroplating of precious metal on that portion of the printed wiring comprising contact finger areas.

FIG. 2 is a sketch of a portion of an insulative substrate as it appears at the same intermediate stage of the fabrication of printed-circuit boards as illustrated in FIG. 1, the substrate and printed wiring thereon being adapted in accordance with a preferred embodiment of this invention for the electroplating of precious metal on contact finger areas.

FIG. 3 is a sketch of a single contact finger area for printed-circuit boards of a type which may be electroplated in accordance with the present invention in the absence of other printed wiring connected thereto and further showing a portion of the path for carrying electroplating current from a contact finger of the type illustrated therein in accordance with this invention.

FIG. 4 is a sketch of a portion of an insulative substrate as it appears at the same intermediate stage of the fabrication of printed-circuit boards as illustrated in FIG. 2, the substrate and printed wiring thereon being adapted for the electroplating of precious metal on contact finger areas in accordance with another preferred embodiment of this invention.

FIG. 5 is a jumbo roll of shielding tape having a conductor of metallic foil adhering to the layer of pressure-sensitive adhesive on the tape.

DETAILED DESCRIPTION OF A PREFERRED EMBODIMENT

In FIG. 1, there is shown a portion of a flat rectangular sheet of insulating substrate 10. For use in certain well-known processes for fabricating printed-circuit boards, the substrate 10 initially has an unbroken thin coating of copper laminated to both sides thereof. An array of through-holes is cut through the substrate and copper is then plated on the interior surfaces of the through-holes also. By photo-engraving techniques which include the steps of coating the copper with a photo-resist material, exposing the photo-resist material to illumination through predetermined photographic representations of desired wiring patterns, stripping away of exposed or non-exposed resist material, plating of a lead-tin alloy on exposed regions of copper and then etching the copper from other regions of the substrate 10, the printed-circuit board is brought to the point in its processing represented in FIG. 1.

It is common practice to place the desired through-hole and wiring pattern for a plurality of printed-circuit boards on a single substrate for the early stages of fabrication. This reduces the number of pieces to be handled in processing and thereby tends to reduce costs. Therefore, in FIG. 1, two identical patterns 12 are indicated generally for two distinct circuit boards on the substrate 10 by way of example. One of the through-holes is designated by reference numeral 16 and one of the printed wires is designated by reference numeral 18 in each of the patterns 12. The lines along which the substrate 10 will eventually be cut, by blanking or routing, to form individual circuit boards are represented by the dashed lines 20 for the individual printed-circuit boards having the patterns 12. It will be understood that, for single-layer two-sided boards such as the one represented in FIG. 1, the through-hole pattern of the reverse side of the substrate 10, not visible in FIG. 1, is the mirror image of that on the visible side. However, the printed wiring pattern on the reverse side will necessarily be different from that on the visible side in order to form functional interconnections between the terminals of the electrical components and circuits intended to be inserted in the through-holes.

At the bottom of each of the circuit board patterns 12, there is shown in FIG. 1 a row of contact finger areas of lead-tin coated copper. Certain of the contact finger areas, or contact tabs, are designated by reference numeral 24 while the remainder are designated by reference numeral 26. The two contact tabs 24 have a relatively greater area than the five contact tabs 26 shown in each pattern area 12. In addition, each one of the two contact tabs 24 are connected to one of the two printed wires 25, each of which has a greater width than the five printed wires 22 individually connected to each of the five contact tabs 26. The greater area of the contact tabs 24 is characteristic of printed wiring intended to carry power, including ground wiring. By providing more area for wiring intended to carry larger currents, current densities may be more easily kept within desired limits. Since the printed-circuit board of FIG. 1 has been stated to be a two-sided board, it will be understood that a similar array of contact tabs will ordinarily be present on the reverse side of the substrate 10 opposite the contact tabs 24 and 26. There is no special significance in the particular number of contact tabs 24 and 26 chosen here for the sake of illustration only.

Disposed vertically along the left and right sides of the substrate 10 in FIG. 1, there are shown two relatively wide areas of printed wiring 28. The wires 28 are expendable auxiliary wiring outside the individual printed-circuit board pattern areas 12 included within dashed lines 20. The printed wires 28 are commonly termed robber areas or, simply, robbers. When the substrate 10 is immersed in an electroplating bath for the purpose of plating lead-tin alloy on those copper regions which are exposed to the bath, the required electrical connections (not shown) to a source of potential are made to these robber areas 28. In lead-tin electroplating, there tends to be an inordinately large amount of deposition in regions where the current density is high, i.e., near the point of application of electrical power. By using robber areas 28 outside the regions of interest, i.e., pattern areas 12, excess build-up of lead-tin alloy is confined to a region of the substrate 10 which will eventually be scrapped. Of course, identical robbers are included on the reverse side of the substrate 10.

At the time of lead-tin electroplating, the copper laminate on both sides of the substrate 10 is substantially intact except to the extent it has been modified by the cutting and plating of the through-holes. Thus, the electroplating current is free to flow from the robber areas 28 to exposed copper portions over the entire expanse of the copper laminate on the substrate 10. However at that time in the fabrication of printed-circuit boards when it is commonly desired to complete the several coating or plating steps by depositing precious metal on the contact tabs 24 and 26, the portions of the original copper laminate not required for the printed wiring will have been etched away from the substrate 10. In order to assure that an electrical connection exists between the source of potential and each of the contact tabs 24 and 26 for electroplating these tabs with precious metal, it has been the prior-art practice to provide a printed wire bus bar 30 connected to a robber area 28. The bus bar 30 is disposed on the substrate 10 along a line substantially parallel to the array of contact tabs 24 and 26 and is separately connected to each individual one of the contact tabs 24 and 26 by a plurality of connecting printed wire leads 32. It will be readily seen that the bus bar 30 and connecting printed wire leads 32 are placed on the substrate 10 outside the pattern areas 12, as limited by dashed lines 20, and thus they too are expendable auxiliary printed wiring on the portion of the substrate 10 which will become scrap.

The steps of electroplating the contact tabs 24 and 26 with precious metal, usually gold, necessarily involve immersing the contact-tab region of the substrate 10 in a succession of baths of suitable liquids. For this purpose, a plurality of substrates 10 are ordinarily fastened into a single rack constructed to hold them parallel to and spaced apart from each other. The several baths are contained in separate tubs. Each of the tubs has a pair of rigid rails disposed above the bath therein, the rails being spaced apart from each other and disposed both parallel to each other and parallel to the surface of the bath. The frames holding the substrates 10 are adapted to be supported by and suspended between the rails with each of the substrates 10 extending a substantially equal distance into the bath. The frames are also adapted to make electrical contact with the robber areas 28. The rails for those tubs containing electrolytic plating solution are electrically conductive and are connected to the negative terminal of a source of electric potential. The frame holding the substrates 10 delivers this potential from the point where the frames are supported on the rails to the robber areas 28. Any exposed metallic surface on a region of a substrate 10 which is thus immersed in an electrolytic plating bath and connected to the potential source is caused to act as a cathode and be plated.

The several baths required commonly include one for stripping the lead-tin alloy from the underlying copper, hydrochloric acid for activating the surfaces to be plated, an electrolytic plating solution for plating nickel on the copper, an electrolytic plating solution for plating gold on the nickel, and intermediate and final rinses of deionized water.

It is desirable from both an economic and an aesthetic point of view to sharply define the boundary of the region in which precious metal will be plated on printed wiring by a straight line. Since none of the printed wiring in the adjacent region on the other side of such a boundary line is used for making contact in connectors to external circuitry, it does not require the precious metal coating. It is not practical to attempt to define the line between the two adjacent regions by the precise dimensioning of the parts and equipment involved in electroplating. Even if the rails and frames were precisely dimensioned, it would be costly to guarantee precise sizing of the substrates 10 and precise positioning of the wiring patterns 12 relative to the boundaries of the substrates 10. In addition, the levels of the surfaces of the liquids comprising the various baths is quite variable due to evaporation, replenishment of liquid and chemicals, and, in some cases, due to required or desirable agitation of one or more of the baths. Therefore, as illustrated in FIG. 1, it has long been the practice to adapt the substrate 10 for plating of the tabs 24 and 26 by providing a sharp line of demarcation for the action of the several baths by placing elongated strips of shielding tape 34 on both sides of the substrate 10 extending entirely across the substrate 10 from one side to the other. The lower edge 36 of the strip of shielding tape 34 is aligned to coincide with the upper boundary of the region, including the contact tabs 24 and 26, which is intended to be subject to immersion in the baths used in the electroplating of precious metal. The mean height to which the surfaces of the several baths will reach on the substrate 10 and the shielding tape 34, in the precious metal processing described above, is indicated by the arrows 38 at the sides of the substrate 10 in FIG. 1. The shielding tape 34 has sufficient width to cover all of those regions of the plated wiring patterns 12, other than the contact tabs 24 and 26, which might otherwise come into contact with the baths mentioned. Satisfactory results have been obtained with a strip of shielding tape 34 which is 1½ inches in width between its lower edge 36 and its upper edge 40. A commercially available product which has been found to be satisfactory to serve as the shielding tape 34 is the Type Y851 tape manufactured and sold by the Minnesota Mining and Manufacturing Company. The tape 34 comprises an elongated strip of resilient insulating material such as the plastic film sold under the trademark Mylar. As supplied by the manufacturer, the tape 34 has a layer of non-setting pressure-sensitive adhesive material coated on one side thereof, the adhesive material being electrically non-conductive and serving to firmly attach the tape to the substrate 10 when pressure is applied thereto but yielding to permit both the tape and the adhesive thereon to be removed without difficulty when it has served its purpose. Once the strip of tape 34 is cut to the required length and correctly positioned on the substrate 10, it is common practice to pass the taped portion of the substrate 10 between resilient pressure rollers to insure that the plastic film with its adhesive coating conforms closely to the profile of the printed wiring at the edges 38 and 40 to form a seal which will prevent the seepage of liquid under the tape 34.

The adaptation of the substrate 10 for electroplating of the contact tabs 24 and 26 with precious metal and the plating process itself as described above in connection with FIG. 1 are all well known to those skilled in the art. In this prior art approach, approximately forty to fifty percent of the precious metal thereby plated is deposited on the bus bar 30, the connecting printed wire leads 32, and those portions of the robbers 28 lying in the region subject to electroplating below the tape edge 36.

FIG. 2 shows a substrate 10 having two printed wire patterns 12 thereon adapted for electroplating the two contact tabs 24 and the five contact tabs 26 thereof with precious metal in accordance with the subject invention. In the embodiment of FIG. 2, a relatively narrow elongated strip of high-purity copper foil 42 is placed on the substrate 10 positioned underneath and covered by the shielding tape 34. The strip of copper foil 42 is disposed parallel to and spaced apart from the edges 36 and 40 of the shielding tape 34 extending entirely across the substrate 10 from side to side. When the taped portion of the substrate 10 is passed between resilient pressure rollers for sealing, as in the prior art discussed above, the copper foil strip 42 under the shielding tape 34 is also sealed from any bath into which the lower portion of the substrate 10 is then immersed both by the plastic film and pressure-sensitive adhesive of the tape 34. The pressure induced by the sealing procedure also serves to insure that the strip of copper foil 42 is brought into good electrical contact with the robber areas 28 and those printed wires 25 and 22 in the wired pattern areas 12 which connect with the contact tabs 24 and 26, respectively. In the embodiment of this invention shown in FIG. 2, the electrically conductive path from the robber areas 28 to the contact tabs 24 and 26 is completed through the copper conductor 42 sealed beneath the shielding tape 34. The need for printing the bus bar 30 and the connecting wires 32 on the substrate 10 as shown in FIG. 1 is eliminated. Therefore, when the substrate 10 is adapted for having its contact tabs 24 and 26 electroplated in accordance with this invention as shown in FIG. 2, the bus bar 30 and connecting wires 32 of FIG. 1 are not present. The quantity of precious metal which is deposited on expendable auxiliary printed wiring on the substrate 10 is thereby significantly reduced. In a preferred embodiment of this invention, the high-purity copper foil used in 1 ounce foil (1 ounce per square foot) cut into an elongated strip ⅜ of an inch wide. Although the copper strip 42 cannot be placed too close to either edge 36 or 40 of the shielding tape 34 without interfering with good sealing, it has been placed as close as 3/32 of an inch to the edge 36 with satisfactory results. A significant advantage of the adaptation of FIG. 2 is that the contact tabs 24 and 26 on the substrate 10 may be electroplated with precious metal using substantially the same equipment, including the racks, and substantially the same procedures, without modification, as was used in the prior art. When a particular manufacturer's equipment for the earlier lead-tin alloy plating step permits it, he should also eliminate those portions of the robbers which are shown extending below the edge 36 of the shielding tape 34 in FIG. 2 from the printed wiring on the substrate 10. This will produce additional savings of precious metal by providing even less exposed metal in the region to be immersed in electroplating baths.

It will be noted that, in FIG. 2, the copper foil conductor 42 electrically contacts each of the five printed wire conductors 22 for carrying plating current to the contact tabs 26. Should any one of the conductors 22 be absent in a particular printed circuit pattern 12, the corresponding contact tab 26 would not then be plated with precious metal. As a practical matter, a failure to plate any individual contact tab not connect to any printed-circuit wire may be of no consequence since no current will ever pass through that tab to or from external circuitry. However, unplated contact tabs may serve to complicate inspection procedures. FIG. 3 shows a single contact tab 46 having a configuration which has been frequently used on certain circuit boards and is well known in the art. The contact tab 46 will have a circuit for plating current to flow to the copper conductor 42 whether or not other printed wiring is connected to the contact tab 46. The contact tab 46 comprises a lower portion 48 intended to be mated with connector assembly pressure contacts and an upper projecting portion 50 which extends under the shielding tape 34 a sufficient distance to meet and electrically contact the copper foil conductor 42 during the steps of electroplating precious metal on the lower portion 48.

In both FIGS. 1 and 2 and the discussion above related thereto, the means provided for carrying electroplating current from the contact tabs 24 and 26 included the auxiliary printed wiring comprising the robber areas 28. As discussed above, the robber areas 28 are particularly useful for electroplating lead-tin alloy on the copper base of printed wiring. Where robber areas are present on a substrate, it is, of course, convenient and appropriate to utilize them in practicing the subject invention by causing the conductor 42 positioned beneath the shielding tape 34 to electrically contact them. However, the usefulness of the subject invention is not impaired when there are no robbers or similar auxiliary wiring on a substrate having contact finger areas requiring electroplating with precious metal. Such circumstances include the situation where the printed wiring is built up by electroless copper deposition and then is protected by a coating of high-purity tin applied by immersion techniques.

As one example, given the configuration of FIG. 2 with the robber areas 28 deleted from the substrate 10, a temporary electrical contact for electroplating can be made by a clip or the like on one end of a conductor connected at its other end to an energized portion of the rack holding the substrate 10. The clip may be attached directly to printed wiring such as, for example, one of the printed wires 25 in the region above the edge 40 of shielding tape 34. A variation of this approach is available where the printed-circuit board being fabricated is a multi-layer board, i.e., one having two or more plates of insulating substrate laminated together with substantially continuous layers of copper sandwiched between the substrate plates for distributing power or providing a ground connection to selected through-holes. Each sandwiched layer of copper must necessarily also be connected to at least one contact finger area by way of a through-hole if it is to serve as a source of power or a ground plane to electrical circuits mounted on the board. Since the copper foil conductor of the subject invention temporarily connects to each other all of the contact tabs on a surface of the substrate which will be electroplated, electroplating current can be drained from each such contact tab into a sandwiched copper layer and thence to an energized probe inserted into one of the selected through-holes at a point of the board outside and above the region of electroplating bath immersion and outside and above the region having the shielding tape thereon.

Still another example of an embodiment of this invention is illustrated in FIG. 4. There, a substitute for a robber is provided in the form of a thin elongated strip of high-purity copper foil 52 disposed on the substrate 10 of FIG. 4 more or less in the same place as the robber area 28 on the right side of the substrate 10 shown in FIG. 2. The foil strip 52 is preferably caused to be removably attached to the substrate 10 by pressure-sensitive adhesive coated on the side thereof facing the substrate 10. The position of the foil strip 52 is such that it completes a circuit from a rack holding the substrate 10, the rack resting on energized rails, to the foil strip 42 beneath the plastic film and sealing adhesive of the shielding tape 34. Racks adapted for use with substrates having robbers may be readily used without significant modification using the embodiment illustrated in FIG. 4. The conductor 52 is preferably terminated beneath the shielding tape 34 without extending below the edge 36 so that it too will be protected from contact with electroplating bath upon immersion therein of the region of substrate 10 on which the contact tabs 24 and 26 are located. With only minor modification, the invention as illustrated in FIG. 4 can also be used on printed-circuit boards already cut to final shape and size along dashed lines 20 by placing the conductor strip 52 in the region on the substrate 20 occupied by the printed wire pattern 12.

In practicing this invention, it is convenient to produce, in advance, a jumbo roll 54 of shielding tape similar to the aforementioned Type Y851 tape but having a conductor for interconnecting the contact finger areas already positioned thereon and adhering thereto as shown in FIG. 5. An elongated strip of plastic film 56 having a coating of pressure-sensitive adhesive 58 on one side thereof also has an elongated strip of high-purity one ounce copper foil 60 caused to adhere to the layer of pressure-sensitive adhesive 58 by pressing the foil 60 against the adhesive 58. The strip of plastic film 56 and layer of pressure-sensitive adhesive 58 are coextensive with each other in both length and width. While the strip of copper foil 60 is coextensive with both the plastic film 56 and adhesive layer 58 in length, it is narrower in width and positioned close enough to one edge of the combined plastic film and adhesive, e.g., 3/32 of an inch, to be suitable for conveniently contacting the upper projecting portion 50 of a contact tap 46 such as the one illustrated in FIG. 3 but not so close to that edge of the film as to interfere with sealing. The jumbo roll of shielding tape 54, as illustrated in FIG. 5, is wound on a hollow cylinder 62 of a suitably rigid material such as pasteboard for convenience in storage and handling as is commonly done with ordinary mending and sealing tapes well known in the art. The cylinder 62 makes the jumbo roll particularly convenient to use when required lengths of shielding tape are to be cut for practicing this invention wherein the cutting may be accomplished either manually or by automatic equipment.

While the invention has been shown and described with reference to certain preferred embodiments thereof, it will be understood by those skilled in the art that various changes in details may be made therein without departing from the spirit and scope of the invention as set out in the following claims.

What is claimed is:

1. A method of electroplating selected printed wiring formed on a first region of a substrate while preventing electroplating of printed wiring formed on an adjacent second region of the substrate, said method comprising the step of:
    forming the printed wiring on said first and second regions of said substrate so that said selected printed wiring on said first region which is to be electroplated is electrically connected to predetermined portions of the printed wiring on said second region which are not to be electroplated;
    positioning a removable shielding tape having a backing of insulative material coated with a non-setting pressure-sensitive insulative adhesive material and having an elongated conductor held on the tape by the adhesive over a second region of the substrate;
    said positioning of the tape and the path of said elongated conductor on said shielding tape being chosen so that said positioning brings said conductor into electrical contact with said predetermined portions of the printed wiring on said second region;
    rolling the substrate between resilient pressure rollers so as to press the shielding tape and its conductor against said second region of the substrate to form a seal which prevents seepage of liquid under the tape during electroplating, said conductor being located sufficiently spaced from the edges of the tape so as not to interfere with the formation of said seal and so as not to be electroplated;
    electroplating onto the selected printed wiring on said first region using said conductor for providing an electrical path for electroplating current to flow to said selected printed wiring via said predetermined portions of said second region; and
    removing the shielding tape along with its conductor after completion of electroplating.

2. A method of electroplating as recited in claim 1 wherein the elongated conductor is an elongated strip of metallic foil.

3. A method of electroplating as recited in claim 1 wherein the backing of the shielding tape is plastic film.

4. The invention in accordance with claim 1, wherein said selected portion of printed wiring on said first region which is to be electroplated includes a particular portion which is not normally electrically connected to any portion of the printed wiring on said second region, and wherein said step of forming includes forming a printed wire which is connected to said particular portion of said first region and extends into said second region so as to be electrically contacted by said conductor during said positioning.

* * * * *